(12) United States Patent
Zhang et al.

(10) Patent No.: US 11,901,186 B2
(45) Date of Patent: Feb. 13, 2024

(54) METHOD OF REDUCING SEMICONDUCTOR SUBSTRATE SURFACE UNEVENNESS

(71) Applicants: Massachusetts Institute of Technology, Cambridge, MA (US); Nanyang Technological University, Singapore (SG); National University of Singapore, Singapore (SG)

(72) Inventors: Li Zhang, Singapore (SG); Kwang Hong Lee, Singapore (SG); Keith Cheng Yeow Ng, Singapore (SG); Kenneth Eng Kian Lee, Singapore (SG); Eugene A. Fitzgerald, Cambridge, MA (US); Soo Jin Chua, Singapore (SG); Chuan Seng Tan, Singapore (SG)

(73) Assignees: Massachusetts Institute of Technology, Cambridge, MA (US); Nanyang Technological University, Singapore (SG); National University of Singapore, Singapore (SG)

( * ) Notice: Subject to any disclaimer, the term of this patent is extended or adjusted under 35 U.S.C. 154(b) by 345 days.

(21) Appl. No.: 15/733,527

(22) PCT Filed: Feb. 19, 2019

(86) PCT No.: PCT/SG2019/050093
§ 371 (c)(1),
(2) Date: Aug. 20, 2020

(87) PCT Pub. No.: WO2019/164449
PCT Pub. Date: Aug. 29, 2019

(65) Prior Publication Data
US 2020/0388501 A1    Dec. 10, 2020

Related U.S. Application Data

(60) Provisional application No. 62/633,903, filed on Feb. 22, 2018.

(51) Int. Cl.
*H01L 21/306* (2006.01)
*B24B 37/04* (2012.01)
(Continued)

(52) U.S. Cl.
CPC ...... *H01L 21/30625* (2013.01); *B24B 37/044* (2013.01); *C09G 1/02* (2013.01);
(Continued)

(58) Field of Classification Search
CPC ......... H01L 21/30625; H01L 21/02381; H01L 21/02433; H01L 21/0254; H01L 24/83;
(Continued)

(56) References Cited

U.S. PATENT DOCUMENTS 5,877,063 A * 3/1999 Gilchrist ................. H01L 28/82
148/DIG. 138
5,897,375 A * 4/1999 Watts ................... C09K 3/1472
106/11
(Continued)

FOREIGN PATENT DOCUMENTS

KR    100737701 B1 *  7/2007  ....... H01L 21/31053
KR    100737701 B1     7/2007
WO    WO-0002235 A1 * 1/2000  ....... H01L 21/31053

OTHER PUBLICATIONS

PCT Notification Concerning Transmittal of International Preliminary Report on Patentability issued in PCT Application No. PCT/SG2019/050093 dated Sep. 3, 2020, pp. 9.
(Continued)

*Primary Examiner* — Benjamin P Sandvik
(74) *Attorney, Agent, or Firm* — Botos Churchill IP Law LLP (57) ABSTRACT

Disclosed is a method of reducing surface unevenness of a semiconductor wafer (100). In a preferred embodiment, the method comprises: removing a portion of a deposited layer and a protective layer thereon using a first slurry to provide an intermediate surface (1123). In the described embodiment, the deposited layer includes an epitaxial layer (112) and the protective layer includes a first dielectric layer (113). The first slurry includes particles with a hardness level the same as or exceeding that of the epitaxial layer (112). A slurry for use in wafer fabrication for reducing surface unevenness of a semiconductor wafer is also disclosed.

14 Claims, 4 Drawing Sheets

(51) Int. Cl.
C09G 1/02 (2006.01)
H01L 21/02 (2006.01)
H01L 23/00 (2006.01)

(52) U.S. Cl.
CPC .... *H01L 21/0254* (2013.01); *H01L 21/02381* (2013.01); *H01L 21/02433* (2013.01); *H01L 24/83* (2013.01); *H01L 2224/83031* (2013.01); *H01L 2224/83896* (2013.01)

(58) Field of Classification Search
CPC . H01L 2224/83031; H01L 2224/83896; H01L 25/162; H01L 21/52; H01L 21/31053; H01L 21/76251; H01L 21/7684; B24B 37/044; C09G 1/02
USPC .......................................................... 438/107
See application file for complete search history.

(56) References Cited

U.S. PATENT DOCUMENTS

| | | | | |
|---|---|---|---|---|
| 6,258,721 B1* | 7/2001 | Li | | H01L 21/02074 451/36 |
| 6,391,780 B1* | 5/2002 | Shih | | H01L 21/3212 438/692 |
| 6,562,251 B1* | 5/2003 | Jordan | | G11B 5/3106 |
| 6,910,942 B1* | 6/2005 | Dornfeld | | B24B 37/013 451/5 |
| 7,090,564 B2* | 8/2006 | Suzuki | | C09G 1/02 451/36 |
| 9,343,321 B2* | 5/2016 | Wang | | H01L 51/56 257/432 |
| 9,502,230 B2* | 11/2016 | Sasaki | | H01L 21/76877 438/643 |
| 9,670,591 B2* | 6/2017 | Bondokov | | H01L 21/76877 438/643 |
| 2002/0077039 A1* | 6/2002 | Wenski | | H01L 21/02024 451/41 |
| 2002/0192940 A1* | 12/2002 | Lee | | H01L 21/76888 257/E21.583 |
| 2003/0137050 A1* | 7/2003 | Chambers | | H01L 21/76834 257/E21.585 |
| 2004/0048478 A1* | 3/2004 | Cheng | | H01L 21/3081 257/E21.232 |
| 2005/0026443 A1* | 2/2005 | Goo | | H01L 21/3125 257/E21.548 |
| 2005/0153561 A1* | 7/2005 | Jin | | H01L 21/7684 438/692 |
| 2005/0185486 A9* | 8/2005 | Lee | | H01L 28/55 257/E21.582 |
| 2006/0043552 A1* | 3/2006 | Suga | | H01L 24/13 257/E21.511 |
| 2006/0143993 A1* | 7/2006 | Kim | | H01L 21/76834 257/E21.585 |
| 2007/0087667 A1* | 4/2007 | Laconto | | H01L 51/56 257/432 |
| 2008/0124913 A1* | 5/2008 | Choi | | H01L 21/7684 438/693 |
| 2008/0261402 A1* | 10/2008 | Lu | | H01L 21/31053 438/693 |
| 2009/0286384 A1* | 11/2009 | Wu | | H01L 51/56 257/432 |
| 2011/0186542 A1 | 8/2011 | Li et al. | | |
| 2013/0032822 A1* | 2/2013 | Ishibashi | | H01L 51/56 257/432 |
| 2013/0334511 A1* | 12/2013 | Savas | | H01L 21/76877 438/643 |
| 2015/0069437 A1* | 3/2015 | Tomizawa | | H01L 33/54 257/98 |
| 2015/0206823 A1* | 7/2015 | Lin | | H01L 21/76877 438/643 |
| 2015/0340269 A1* | 11/2015 | Rivoire | | H01L 21/76843 438/653 |
| 2016/0329419 A1* | 11/2016 | Ogawa | | B24B 1/04 210/695 |
| 2017/0110332 A1* | 4/2017 | Beveridge | | H01L 21/7684 438/692 |
| 2017/0358666 A1* | 12/2017 | Chi | | H01L 21/7684 438/693 |
| 2018/0033636 A1 | 2/2018 | Hsu et al. | | |
| 2020/0388501 A1* | 12/2020 | Zhang | | H01L 21/76877 438/643 |

OTHER PUBLICATIONS

Examination Report issued in UK application No. GB2012652.0 dated Oct. 29, 2021, pp. 2.
Aida, H. , et al., "Chemical Mechanical Polishing of Gallium Nitride with Colloidal Silica", Journal of The Electrochemical Society, 158, H1206-H1212, (2011), 8 pages.
Aida, H. , et al., "Precise mechanical polishing of brittle materials with free diamond abrasives dispersed in micro-nano-bubble water", Precision Engineering, vol. 40, (2015), pp. 81-86.
Lee, H. , et al., "Application of electrolytic in-process dressing(ELID)grinding and chemical mechanical polishing(CMP) process for emerging hard-brittle materials used in light-emitting diodes", Journal of Crystal Growth 326, (2011), pp. 140-146.
Lee, G. S. , et al., "The Effect of Slurry Composition and Flatness on Sub-Surface Damage and Removal in Chemical Mechanical Polishing of 6H-SiC", Materials Science Forum (Online: Mar. 2, 2009), ISSN: 1662-9752, vols. 615-617, Mar. 2, 2009, pp. 605-608, available at https://www.scientific.net/MSF.615-617.605.
International Search Report issued in PCT application No. PCT/SG2019/050093 dated May 9, 2019.
Written Opinion issued in PCT application No. PCT/SG2019/050093 dated May 9, 2019.
Ein-Eli Y., et al., Review on copper chemical-mechanical polishing (CMP) and post-CMP cleaning in ultra large system integrated (ULSI)—An electrochemical perspective. E/ectrochimica Acta , Sep. 7, 2006, vol. 52,, pp. 1825-1838.
Office Action and Search Report for Taiwanese Patent Application No. 108105836, dated Jun. 30, 2022.

* cited by examiner

METHOD OF REDUCING SEMICONDUCTOR SUBSTRATE SURFACE UNEVENNESS

CROSS-REFERENCE TO RELATED APPLICATIONS

This application is a national stage entry under 35 U.S.C. § 371 of International Application No. PCT/SG2019/050093, filed Feb. 19, 2019, which claims the benefit of U.S. Provisional Application No. 62/633,903, filed Feb. 22, 2018, the contents of all of which are incorporated by reference herein in their entirety.

TECHNICAL FIELD

The present invention relates to a method of reducing surface unevenness, a semiconductor substrate obtained by the method, and a slurry for use in semiconductor substrate fabrication.

BACKGROUND

For the growth of semiconductor devices, often it was discovered that surface imperfections such as voids and surface protrusions exist on the semiconductor materials. The size of the surface imperfections could range from nanometer scale to millimeter scale and they are generated or formed by different mechanisms. Pre-existing particles from ex situ sources such as epitaxy tool, process environment and substrate manufacturing alter the local gas flow, temperature and chemistry during the epitaxy process. The growth imperfections around the particles manifest itself as surface imperfections. In the case of GaN epitaxial growth on Si substrate, pre-existing particles on the Si substrate create openings in the AlN nucleation layer. In the subsequent growth of GaN, a eutectic reaction between Ga and Si takes place at the openings. This is commonly known as melt-back etching which is characterised by a void in the surface of the wafer (or the semiconductor substrate) and a large surrounding area of materials with surface protrusions containing polycrystalline III-nitride and Si eutectics. Particles could also be generated in situ. Although most epitaxy tools are designed to minimize gas phase nucleation during the epitaxy process, particles that are formed in the gas phase reaction are unavoidable. Usually, these particles acting as nucleus for polycrystalline nucleation are the sources of surface protrusions too. Furthermore, protrusions could also be created during the epitaxial growth without particles. In the epitaxy process of III-nitride, hillocks or hexagonal voids could be created due to crystallographic defects such inversion domain boundaries, stacking faults and threading dislocations.

In general, surface imperfections in semiconductors reduce the fabrication yield in the device processing and pose concerns on the reliability of these devices. For example, protrusions prevent the direct contact of the two wafers in a wafer bonding process and create unbonded areas which are order of magnitude greater than the protrusions themselves. Surface voids acting as traps of gases and impurities could create unbonded areas too. Usually, the voids can be passivated with deposition and planarization of insulating dielectric material such as $SiO_2$ and $Si_3N_4$. However, the removal of surface protrusions is difficult.

Figure 1:
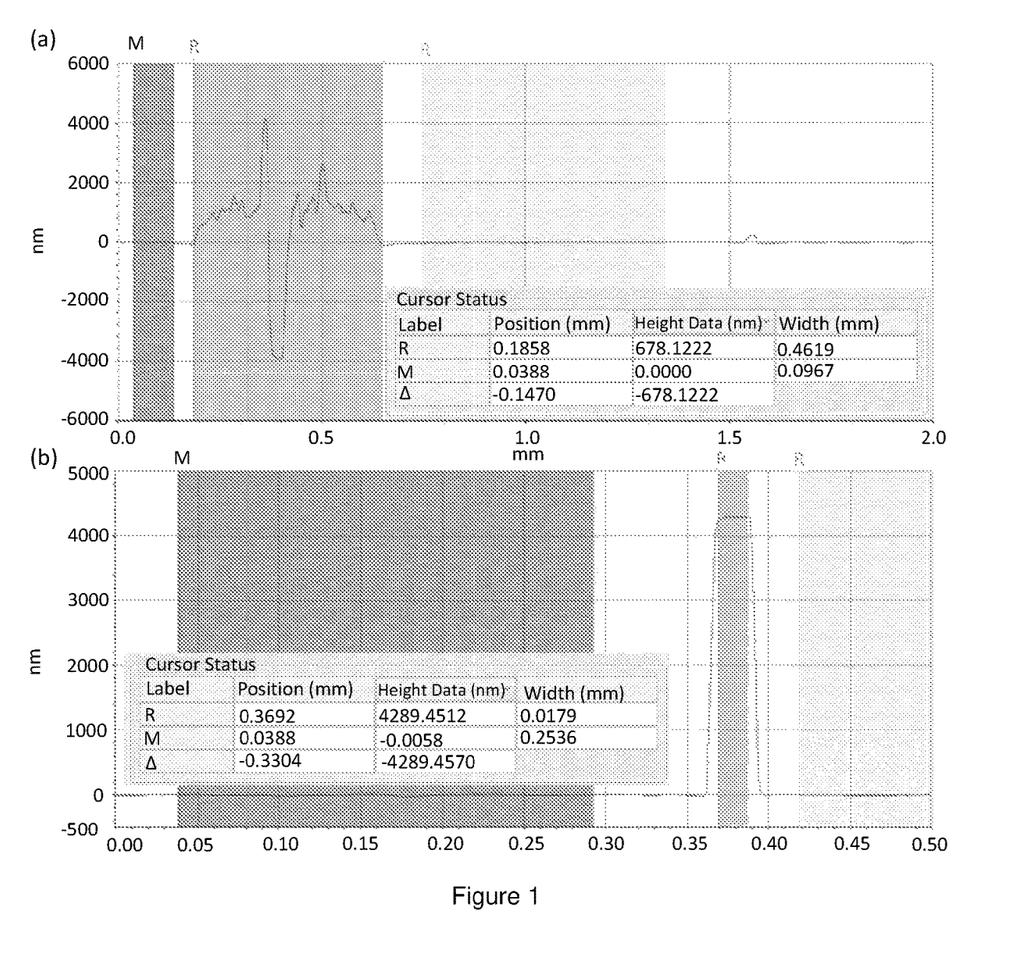
FIGS. 1(a) and 1(b) are height profile graphs of a melt-back site and a hillock site of a conventionally fabricated GaN-on-Si wafer, respectively.

A conventionally fabricated GaN-on-Si wafer typically includes surface protrusions including both melt-back sites and hillock sites. FIGS. 1(a) and (b) are the height profiles of a melt-back site and a hillock site of such a GaN-on-Si wafer respectively. The total thickness of the III-nitride epitaxial layers on the Si substrate is 3.7 μm. A melt-back site consists of a central void region in the surface of the wafer and a surrounding region with rough protrusions. The hillock structure is characterized by a protrusion with a well-defined hexagon with a smooth top surface. Both protrusion types are about 4 μm higher than the surface of the GaN layer.

Figure 2:
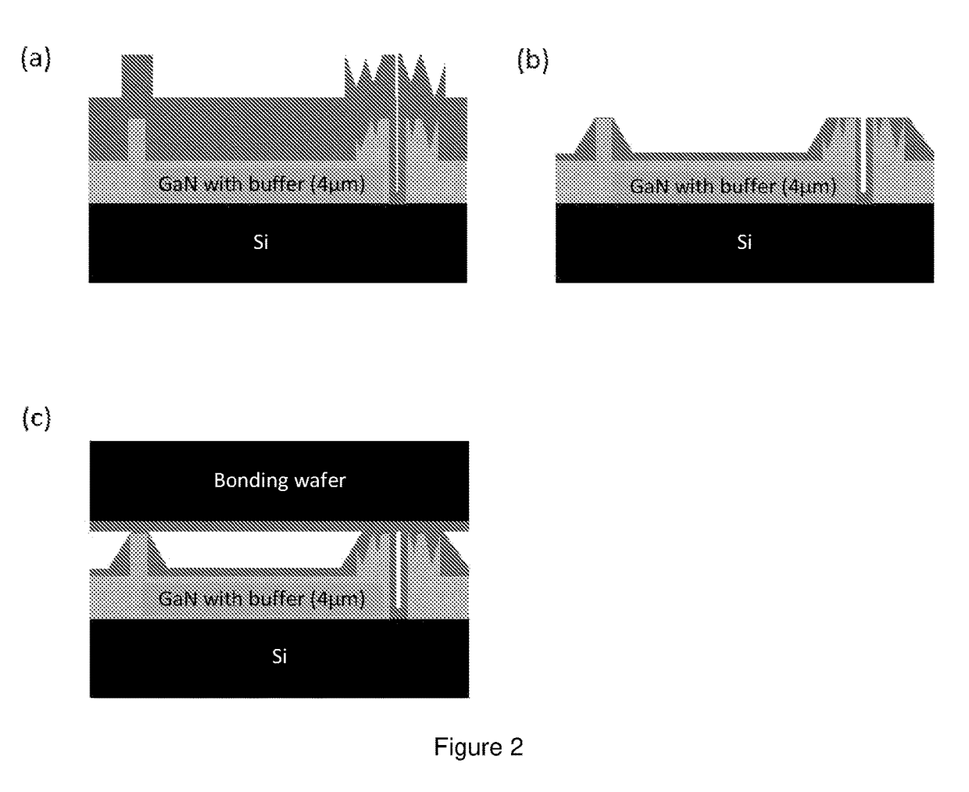
FIGS. 2(a), 2(b) and 2(c) are schematic representations of a semiconductor wafer at respective stages of a conventional wafer bonding process.

During a hydrophilic $SiO_2$—$SiO_2$ wafer bonding process, $SiO_2$ is deposited conformably by a PECVD process on the GaN-on-Si wafer. The height difference caused by surface protrusions will remain after the PECVD process as illustrated in the schematic drawing in FIG. 2(a). A CMP step which employs a normal $SiO_2$ slurry is carried out to remove part of the $SiO_2$ layer to reduce the surface roughness. However, the $SiO_2$ slurry is not effective at removing the surface protrusions such as the hillock and melt-back sites which are made of III-nitride and Si based materials, as illustrated in FIG. 2(b). In the subsequent wafer bonding process, large unbonded regions are created due to the surface protrusions as illustrated in FIG. 2(c). In principle, the unbonded areas can be reduced if a thick $SiO_2$ layer (more than a few times the thickness of the GaN layer) is deposited and/or many iterations of $SiO_2$ deposition+CMP process are applied.

The prior-art bonding process suffers from the following shortcomings:
(1) The additional $SiO_2$ deposition exerts more stress on the GaN wafer and may cause plastic deformation of the epitaxial layer and the substrate, especially at the edge of the GaN-on-Si wafer;
(2) The wafer bow change is increased by the additional $SiO_2$ layer, so that the non-uniformity in the CMP process will induce non-uniformity in the final bonding oxide thickness;
(3) Many iterations of $SiO_2$ deposition and CMP process are time consuming; and
(4) It is difficult to avoid unbonded area if the density of surface protrusions is high (a few hundred per 200 mm diameter wafer).

It is desirable to provide a method, a semiconductor substrate and a slurry which addresses at least one of the drawbacks of the prior art and/or to provide the public with a useful choice.

SUMMARY

According to one aspect, there is provided a method of reducing surface unevenness of a semiconductor substrate, the method comprising: removing a portion of a deposited layer and a protective layer thereon using a first slurry to provide an intermediate surface, the first slurry including particles with a hardness level the same as or exceeding that of the deposited layer.

In a described embodiment, a portion of the deposited layer and the protective layer is removed using the first slurry so that the intermediate surface has reduced surface imperfections, such as melt-back and hillock sites, for the deposition of a second dielectric layer thereon. The first slurry includes particles with a hardness level the same as or exceeding that of the deposited layer to enable the first slurry to mechanically remove the portion of the deposited layer and the protective layer to provide the intermediate surface.

It may well be that this removal step may not remove 'any' surface imperfection fully. For example, if there were twenty surface imperfections (of any kind) on the substrate at the start, there may still be twenty after this first removal step, although these twenty surface imperfections should be reduced in height/relief, preferably to a point that a second protective (e.g. dielectric) layer deposition step may be used to fully contact and cover the reduced imperfections. It is also possible that if the relief of the twenty surface imperfections is still too high, another protective (e.g. dielectric) layer deposition plus the first slurry removal step may be carried out; this may be needed for a starting surface that has an especially high density of defects, and more so if they are very large. In this respect, it is desirable to 'polish' the intermediate surface so that the size of the imperfections may be reduced to achieve better bonding.

The deposited layer may be epitaxially deposited, or may be formed by physical vapour deposition or chemical vapour deposition.

If there is a need to repeat the deposition and polishing steps, the method may further comprise, after the portion of the deposited layer and the protective layer is removed, depositing more of the protective layer to the intermediate surface and removing a further portion of the deposited layer and the protective layer using the first slurry to form a further intermediate surface.

As discussed above, the method may include depositing a further protective layer in the form of a second dielectric layer on the intermediate surface and removing a portion of the second dielectric layer using a second slurry to provide an improved bonding surface with reduced surface imperfections, thereby achieving a relatively even and strong bond. Yield loss attributed to surface imperfections may thus be reduced.

Preferably, the particles in the first slurry may not found in the second slurry. The protective layers may have the same material. Advantageously, the particles in the first slurry are diamond particles.

Specifically, the particles of the first slurry may have a concentration of more than about 2% and not more than about 10%. In a specific example the first and/or further protective layer may be a dielectric layer. Preferably, the deposited layer may be a semiconductor layer, metal layer, or dielectric layer.

More specifically, the deposited layer may include one of gallium nitride (GaN), silicon dioxide ($SiO_2$), silicon nitride (SiN), copper (Cu) and tungsten (W).

The intermediate surface may be provided in part by a residual portion of the protective layer. For example, the intermediate surface may be provided by a small portion of the deposited layer and the residual portion of the protective layer. Alternatively, the method may include removing the residual portion of the protective layer, wherein a remaining portion of the deposited layer provides the intermediate surface. For example, the remaining portion of the deposited layer includes said small portion and other exposed portions of the deposited layer.

The method may further include forming a bonding surface from the intermediate surface. The bonding surface may, for example, be for bonding with another semiconductor layer to form a wafer.

According to another aspect, there is provided a slurry for use in substrate fabrication for reducing surface unevenness of a semiconductor substrate, the semiconductor substrate having a deposited layer and a protective layer, the first slurry including particles with a hardness level the same as or exceeding that of the deposited layer to enable the first slurry to remove a portion of the deposited layer and the protective layer thereon to provide an intermediate surface.

In a described embodiment, the particles are in the form of diamond particles, and a portion of the protective layer and an underlying deposited layer may be removed to provide the intermediate surface for, for example, the deposition of another protective (e.g. dielectric) layer thereon. The method is applicable to a wafer bonding process, and may also be applicable to other semiconductor processes, to reduce yield loss caused by surface unevenness or imperfections. As a result, the intermediate surface may be used as a bonding surface or the intermediate surface may be etched to transfer a resist pattern to the deposited layer.

It is envisaged that features relating to one aspect may be applicable to the other aspects.

BRIEF DESCRIPTION OF THE DRAWINGS

Example embodiments will now be described hereinafter with reference to the accompanying drawings, wherein like parts are denoted by like reference numerals. Among the drawings.

DETAILED DESCRIPTION

FIGS. 3(a) to 3(d) are schematic illustrations of respective stages of a method of reducing wafer surface unevenness (e.g., surface protrusions) or generally surface unevenness of a semiconductor substrate according to one example embodiment.

FIG. 3(a) illustrates a semiconductor wafer 100 formed from a known PECVD process and including a substrate layer 111 of Si, a deposited layer in the form of an epitaxial layer 112 of GaN arranged on the substrate layer 111, and a protective layer in the form of a first dielectric layer 113 of $SiO_2$ deposited on the epitaxial layer 112.

As illustrated in FIG. 3(b), in a first step of the method, a portion of the epitaxial layer 112 and the first dielectric layer 113 thereon are removed using a first slurry (not shown) to provide an even intermediate surface 1123. That is, the epitaxial layer 112 and the first dielectric layer 113 thereon are partially removed using the first slurry. In other words, the first step includes removing the portion of the deposited layer (i.e., the epitaxial layer 112) and the protective layer (i.e., the first dielectric layer 113) thereon using the first slurry to provide the intermediate surface 1123. In this step, which may be a chemical-mechanical polishing (CMP) or mechanical partial-removing step, the first slurry has a predetermined concentration of diamond particles for mechanically removing the portion of the epitaxial layer 112 and the first dielectric layer 113, thereby reducing protrusions or imperfections in the epitaxial layer 112 and the first dielectric layer 113. The first slurry includes a first slurry base material which may or may not have a contribution towards the partial removal of the first dielectric layer 113.

The predetermined concentration of the diamond particles in this embodiment is more than about 2% and not more than about 10%. It should be noted that the first slurry may, in other embodiments, have a predetermined concentration of other suitable particles, as long as the particles have a hardness level the same as or exceeding that of the epitaxial layer 112. SiC particles are such other suitable particles, for example. The concentration of diamond particles in the first slurry has a substantially uniform removal rate with respect to the material of the epitaxial layer 112 (i.e., GaN).

Initially, the CMP removal rate (RR) is higher (i.e., faster removal) at the protrusion materials because they protrude from the first dielectric layer 113. Once the protrusion materials are level with the first dielectric layer 113, the CMP removal rate is about the same over the GaN or any protrusion materials as well as the first dielectric layer 113, so that after the CMP process the protrusion materials are at the same level as the first dielectric layer 113' (see FIG. 3(b)). In other words, starting at FIG. 3(a), the polishing rate/material RR at the protrusions is higher (i.e., faster removal) than the RR in the remaining "field area" (i.e. protrusion-free regions, or regions where there are no protrusions). The protrusions that are "sticking out" will be abraded more by the first slurry particles as they would be in "closer" contact with the polishing or removing surface. This operation results in a surface similar to that depicted in FIG. 3(b), as the RR rate starts to even out as the protrusions are gradually removed and the surface relief becomes reduced. This is because the diamond particles in the first slurry achieve their removal/polishing action or effect mostly through a physical process (i.e. mostly abrasion), with little to no chemical selectivity (i.e. preferential etching/dissolution of one material over another).

The melt-back and hillock sites may not be removed completely. They are substantially reduced to the same level as the first dielectric layer 113' (see FIG. 3(b)) after the CMP using the first slurry. This step can be repeated until the surface is flat and until a desired height of the protrusion materials is reached. In particular, the first dielectric layer 113 and the surface protrusions (melt-back sites and hillock sites, marked by "M" and "H" in FIG. 3(a), respectively) are reduced in thickness or height from 4 μm to less than 100 nm as illustrated in FIGS. 4(a) and 4(b). As shown in FIG. 3(b), small, residual portions 113' of the first dielectric layer 113 remain and small portions 112' of the epitaxial layer 112 are exposed. Together, the portions 112', 113' provide or define the even intermediate surface 1123. Following the first step, any residual portions of the first slurry is rinsed off. Depending on the original heights of the reduced melt-back and hillock sites, the first step and the preceding PECVD oxide deposition process may be repeated. It should be appreciated that after the first step, substantial protrusion materials would have been removed resulting in a smoother intermediate surface 1123. Specifically, it might be possible to reduce 4 μm protrusions down to around 100 nm and this would result in the intermediate surface 1123 usable for etching/deposition processes. However, the intermediate surface 1123 may still not be sufficiently smooth (due to fast RR, high and non-optimized concentration of diamond particles) and unsuitable for bonding and in this case, the method could include further steps as explained below to smoothen the surface further.

In a second step of the method, referring to FIG. 3(c), a further protective layer in the form of a second dielectric layer 114 of $SiO_2$ is deposited on the intermediate surface 1123 by means of a PECVD oxide deposition process. The first and second dielectric layers 113, 114 may have the same or different materials. That is, the second step includes depositing the further protective layer 114 to the intermediate surface 1123.

In a third step of the method, which is a CMP step, a portion of the second dielectric layer 114 is removed using a second slurry, which, in this embodiment, does not contain the predetermined concentration of particles. As a result of the third step, surface roughness and/or unevenness (e.g., protrusions) of the deposited second dielectric layer 114 is reduced, thereby providing a further intermediate surface 1141 for bonding of the wafer 100 with another wafer 200, as depicted in FIG. 3(d). That is, the third step includes removing the portion of the deposited further protective layer 114 to form the further intermediate surface 1141, and the bonding surface is formed from the further intermediate surface 1141 in this embodiment. It should be noted that in other embodiments, the third step may be a non-CMP step requiring no slurry for reducing the second dielectric layer 114. The second and third steps may optionally be repeated at least once, with the second step of each new iteration resulting in a yet further protective layer deposited on the further intermediate surface of the third step of the previous iteration, and with the third step of each new iteration resulting in the yet further protective layer partially removed using the second slurry or a different slurry to provide a yet further intermediate surface for either another iteration, bonding with the wafer 200, or any other processing.

In this embodiment, the second slurry includes a second slurry base material and includes silicon dioxide ($SiO_2$) particles for removing partially the second dielectric layer 114. The first slurry in this embodiment is based on the second slurry (i.e., having the second slurry as the first slurry base material and hence containing $SiO_2$ particles) and, as described hereinabove, further has the predetermined concentration of diamond particles which, in this embodiment, is not found in the second slurry.

The first slurry is thus effective in partially removing the first dielectric layer 113 and the epitaxial layer 112 to provide the intermediate surface 1123, and the second slurry in partially removing the second dielectric layer 114 deposited on the intermediate surface 1123 in order to polish the second dielectric layer 114. In other embodiments, however, the first and second slurries may have different bases, with the first slurry containing particles, diamond or non-diamond, having a hardness level the same as or exceeding that of the epitaxial layer 112.

To elaborate further, considerations for the two slurries in this embodiment are:

a) the first slurry—configured to be able to abrade the protrusion material (i.e. hardness criterion) present in the epitaxial layer 112, using predominantly physical/mechanical means (as opposed to chemical), namely the diamond particles, so as to ensure that the protrusions (as they stick out/protrude) are removed at a higher rate than the first dielectric layer 113 displaced over the regions of the wafer being protected, resulting in the surface obtained in FIG. 3(b); and b) the second slurry—configured to be able to polish the second dielectric layer 114 to provide the further intermediate surface 1141 of sufficient evenness or flatness for, for example, bonding with another wafer 200 (typically involving both physical and chemical activities, hence the term chemical-mechanical polishing).

Thus, the first slurry may or may not be based on the second slurry.

The dielectric layers 113, 114 are made of $SiO_2$ in this embodiment, and can be made of a different material (e.g., Si$_3$N$_4$) in other embodiments (which may mean using a different second slurry for the polishing step or the third step). That is to say, the dielectric layers 113, 114 may be made of different, respective materials, as long as the first dielectric layer 113 can be removed by the first slurry, and the second dielectric layer 114 can be removed by the second slurry or other suitable means. For example, where the first dielectric layer 113 is made of SiN and the second dielectric layer 114 is made of SiO2, the first and second slurries may have different base materials. A first slurry based on SiN particles may be used to smoothen the first dielectric layer 113 made of SiN, while a second slurry based on SiO2 particles may be used to smoothen the second dielectric layer 114 made of SiO2.

The first slurry can be produced by weighing the desired concentration or amount of diamond particles, and mixing and stirring the diamond particles in the first slurry base material to form the first slurry. Thus, a skilled person would appreciate that one difference with respect to the prior art resides in the insertion of an additional CMP step (i.e., the first step) employing a slurry, i.e., the first slurry, with a concentration of diamond particles of, for example, more than about 2% not more than about 10% mixed in a SiO$_2$ slurry. The concentration range and the type of particles used in the first slurry may be otherwise in other embodiments. The deposited layer may be a semiconductor layer, a metal layer, or a dielectric layer. The deposited layer may include one of gallium nitride (GaN), silicon dioxide (SiO$_2$), silicon nitride (SiN), copper (Cu) and tungsten (W).

With the method, surface unevenness or imperfection attributed to melt-back and hillock sites of significant diameters (>1 mm in diameter) may be substantially reduced. Indeed, it may be observed through infrared image comparison, for example, that the method of FIG. 3 is able to reduce significant surface unevenness to such a point that the bond quality may be as good as bonding wafers with negligible starting/initial defects.

Figure 3:
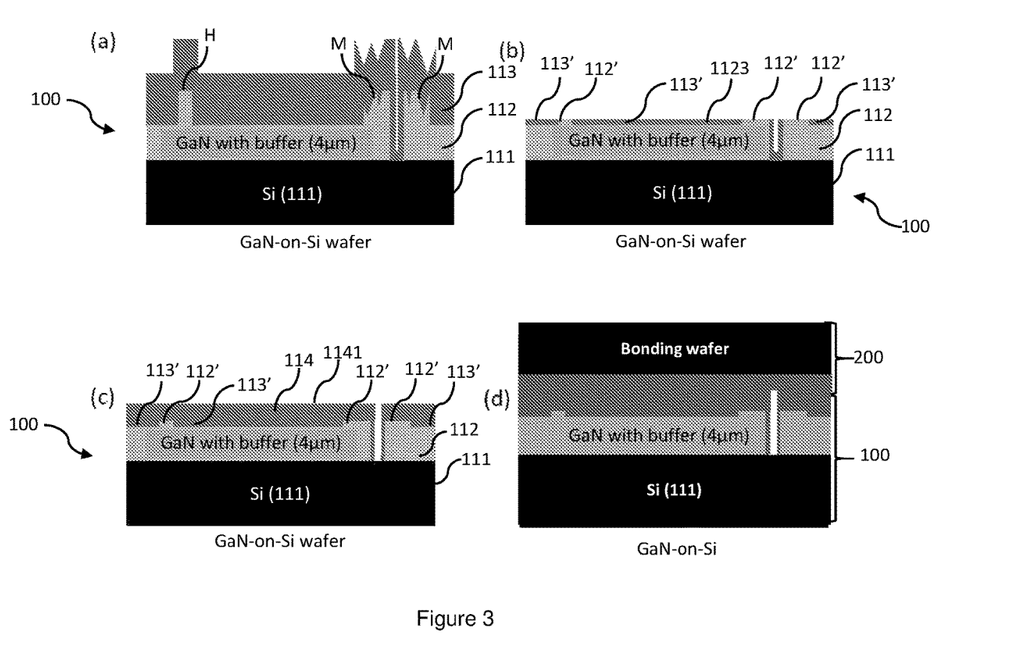
FIGS. 3(a) to 3(d) are schematic representations of a semiconductor wafer at respective stages of a wafer bonding process according to an embodiment of the present invention.
Figure 4:
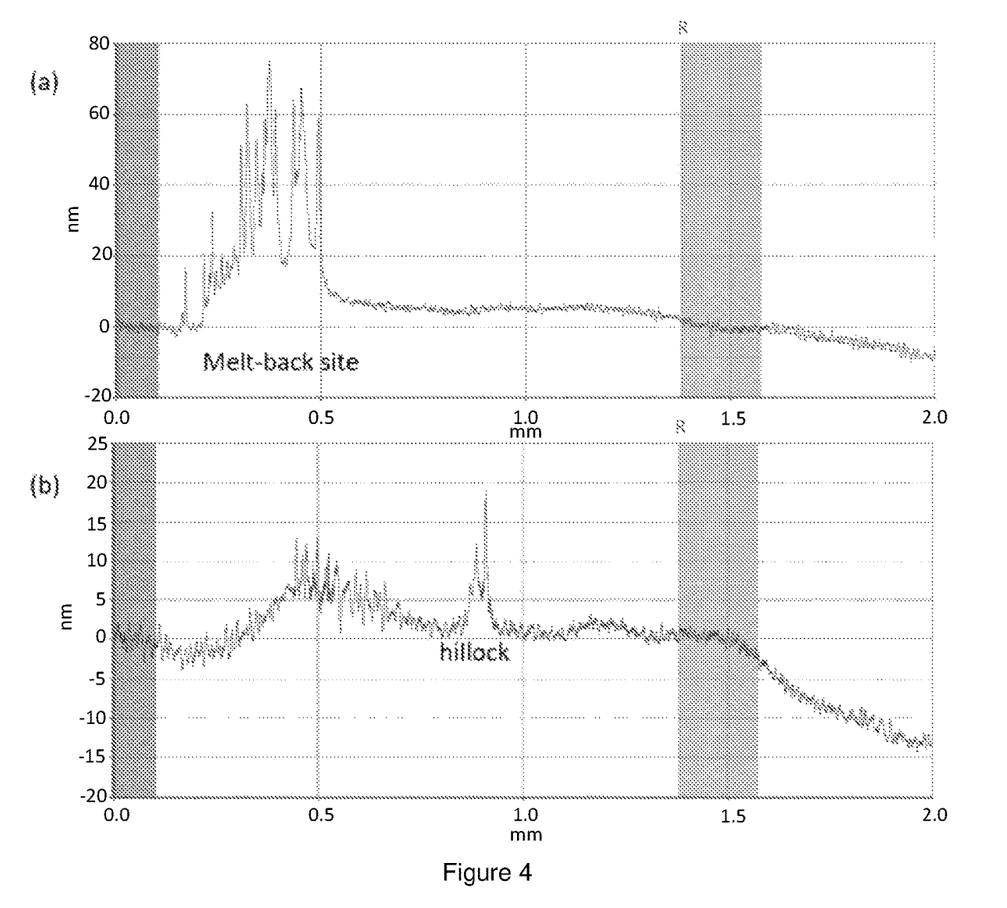
FIGS. 4(a) and 4(b) show height profile graphs of a melt-back site and a hillock site, respectively, on a wafer surface processed according to the embodiment of FIGS. 3(a) to 3(d).

In the embodiment of FIG. 3, the intermediate surface 1123 is provided in part by the residual portions 113' of the first dielectric layer 113. In an alternative embodiment, the method may further include removing the residual portion 113' of the first dielectric layer 113 completely by any suitable means so that the intermediate surface 1123 is formed from or provided by a remaining portion of the epitaxial layer 112. For example, the residual portion 113' may be removed by wet-etching or dry-etching, preferably with chemical selectivity between the residual portion 113' and the deposited epitaxial layer 112. The remaining portion of the epitaxial layer 112 includes the small portions 112' and other portions of the epitaxial layer 112 now exposed with the removal of the residual portion 113'.

In addition, in the embodiment of FIG. 3, the bonding surface is formed from the further intermediate surface 1141 (or the yet further intermediate surface if the second and third steps are repeated). It is envisaged that it may be possible for the intermediate surface 1123 to be used as the bonding surface for IC fabrication after the first step (i.e. without the second and third steps) but the bonding yield is unlikely to be good. Indeed, it has been found that if the residual portions of 113' are removed completely as discussed above, the presence of ~100 nm protrusions might mean that the bonding yield would be pretty poor (although better than if the first step was not performed at all). On the other hand, with the residual portion 113' in place on the intermediate surface 1123, this might lead to better or more decent outcomes. To achieve better results, performing the second and third steps of the method to get to the further intermediate surface 1141 as the bonding surface is preferred.

Indeed, it is envisaged that the described embodiment may not be restricted to using the intermediate surface 1123 (or the further intermediate surface 1141) for bonding but the surface may be subject to other types of processing (such as general etching or deposition processes), regardless of whether the residual portions 113' of the first dielectric layer 113 are removed. The reduction of surface defects (e.g., the flattening of protrusions) enhances the uniformity (and hence the processing yield) of any subsequent semiconductor processes. Such processes include, for example: deposition of thin films on the intermediate surface 1123 via methods such as chemical vapour deposition (CVD), physical vapour deposition (PVD) or atomic layer deposition (ALD); and etching of the intermediate surface 1123 via plasma etching (e.g. reactive ion etching, inductively-coupled plasma reactive ion etching (ICP-RIE), ion beam etching (IBE) etc.) to transfer a resist pattern to the epitaxial layer 112, or deposition of layers/films using spin-coating techniques (e.g. spin-coating photoresist, and spin-on glass).

For example, the residual portion 113' of the first dielectric layer 113 can be removed completely after the first step (FIG. 3(b)) if a process is to be performed with respect to the underlying epitaxial layer 112 (e.g., depositing a metal film directly on the epitaxial layer 112 to form a contact). This may also be done to characterize the surface of the epitaxial layer 112 after the first step. However, the residual portion 113' may not have to be removed in some circumstances, for example, where a step after the first step is to deposit a dielectric passivation layer or a lithography hardmask on the intermediate surface 1123.

The method of reducing surface unevenness of a semiconductor wafer or substrate offers at least the following advantages:

(1) Excellent ability to reduce any surface protrusions on the wafer surface or the substrate surface as the first slurry is rate non-selective over a wide range of materials;
(2) No damage is introduced to the wafer surface or the substrate surface except to the protrusions as the residual SiO$_2$ layer (i.e., the portions 113') serves as a surface protection layer to the underlying GaN surface; and
(3) The process is cost-effective as the process may involve as few as one additional reducing step (the first step) followed, in some embodiments, by one additional SiO$_2$ deposition (the second step).

The invention claimed is:

1. A method of reducing surface unevenness of a semiconductor substrate, the semiconductor substrate comprising a deposited layer having surface protrusions resulting from growth imperfections in depositing the deposited layer and a protective layer deposited on the deposited layer, the method comprising:

removing a portion of the deposited layer and the protective layer using a first slurry to reduce the surface protrusions of the deposited layer and to provide an intermediate surface, the first slurry having particles with a hardness level the same as or exceeding that of the deposited layer, wherein the first slurry is adapted to mechanically remove the portion of the deposited layer and the protective layer at a similar removal rate once the surface protrusions are reduced to level with the protective layer to provide the intermediate surface;

depositing a further protective layer on the intermediate surface; and removing a portion of the further protective layer using a second slurry to reduce surface roughness of the further protective layer and to provide a further intermediate surface, wherein the deposited layer is a semiconductor layer, and wherein the further protective layer comprises a dielectric layer.

2. The method of claim 1, wherein the deposited layer is epitaxially deposited, or formed by physical vapour deposition or chemical vapour deposition.

3. The method of claim 1, further comprising, after removing the portion of the deposited layer and the protective layer, depositing more of the protective layer to the intermediate surface and removing a further portion of the deposited layer and the protective layer using the first slurry prior to depositing the further protective layer.

4. The method of claim 1, wherein the particles are not found in the second slurry.

5. The method of claim 1, wherein the protective layer and the further protective layer include a same material.

6. The method of claim 1, wherein the particles are diamond particles.

7. The method of claim 1, wherein the particles have a concentration of more than about 2 weight percent (wt %) and not more than about 10 weight percent (wt %).

8. The method of claim 1, wherein the protective layer is a dielectric layer.

9. The method of claim 1, wherein the deposited layer includes gallium nitride (GaN).

10. The method of claim 1, wherein the intermediate surface is provided in part by a residual portion of the protective layer.

11. The method of claim 10, further comprising:
removing the residual portion of the protective layer, wherein a remaining portion of the deposited layer provides the intermediate surface.

12. The method of claim 1, further comprising:
forming a bonding surface from the further intermediate surface.

13. The method of claim 1,
etching the further intermediate surface to transfer a resist pattern to the deposited layer.

14. The method of claim 1, wherein the surface protrusions include a melt-back site or a hillock site.

* * * * *